United States Patent
Huo et al.

(10) Patent No.: US 8,482,280 B2
(45) Date of Patent: Jul. 9, 2013

(54) SYSTEM AND METHOD FOR PROPELLER MAGNETIC RESONANCE IMAGING WITH NON-PARALLEL BLADELETS

(75) Inventors: Donglai Huo, Waukesha, WI (US); James Grant Pipe, Glendale, AZ (US)

(73) Assignee: Dignity Health, Phoenix, AZ (US)

( * ) Notice: Subject to any disclaimer, the term of this patent is extended or adjusted under 35 U.S.C. 154(b) by 630 days.

(21) Appl. No.: 12/693,100

(22) Filed: Jan. 25, 2010

(65) Prior Publication Data

US 2010/0188085 A1 Jul. 29, 2010

Related U.S. Application Data

(60) Provisional application No. 61/146,688, filed on Jan. 23, 2009.

(51) Int. Cl.
*G01R 33/4818* (2006.01)
*G01R 33/4824* (2006.01)
*G01R 33/5611* (2006.01)

(52) U.S. Cl.
USPC .......................... 324/309; 324/307; 324/318

(58) Field of Classification Search
USPC .... 324/300–322; 600/407–435; 382/128–131
See application file for complete search history.

(56) References Cited

U.S. PATENT DOCUMENTS

| | | | | |
|---|---|---|---|---|
| 5,810,726 A * | 9/1998 | Van Vaals et al. | | 600/410 |
| 6,515,477 B1 * | 2/2003 | Tasaka et al. | | 324/309 |
| 6,882,148 B2 * | 4/2005 | Pipe | | 324/307 |
| 7,023,207 B1 * | 4/2006 | Gaddipati et al. | | 324/309 |
| 7,030,609 B2 * | 4/2006 | Pipe | | 324/309 |
| 7,245,125 B2 * | 7/2007 | Harer et al. | | 324/310 |
| 7,382,127 B2 * | 6/2008 | Gaddipati et al. | | 324/309 |
| 7,408,345 B2 * | 8/2008 | Bammer et al. | | 324/307 |
| 7,535,222 B2 * | 5/2009 | Bammer et al. | | 324/307 |
| 7,619,410 B2 * | 11/2009 | Beatty et al. | | 324/307 |
| 7,821,262 B2 * | 10/2010 | Kannengiesser et al. | | 324/307 |
| 8,384,384 B2 * | 2/2013 | Zhao et al. | | 324/309 |
| 2005/0007114 A1 * | 1/2005 | Pipe | | 324/309 |
| 2005/0073303 A1 * | 4/2005 | Harer et al. | | 324/307 |
| 2005/0127912 A1 * | 6/2005 | Pipe | | 324/309 |

(Continued)

OTHER PUBLICATIONS

Pipe et al., "Multishot Diffusion-Weighted FSE Using PROPELLER MRI," Magnetic Resonance in Medicine, vol. 47, pp. 42-52, 2002.

(Continued)

*Primary Examiner* — Melissa Koval
*Assistant Examiner* — Tiffany Fetzner
(74) *Attorney, Agent, or Firm* — Ziolkowski Patent Solutions Group, SC

(57) ABSTRACT

A system and method include a computer readable storage medium having stored thereon a computer program comprising instructions which when executed by a computer cause the computer to apply a first plurality of radio frequency (RF) pulses during a first repetition time (TR) interval of a magnetic resonance (MR) pulse sequence. The instructions also cause the computer to apply a first plurality of gradient pulses and acquire the MR data during application of each gradient pulse of the first plurality of gradient pulses between an adjacent pair of RF pulses of the first plurality of RF pulses. Each gradient pulse of the first plurality of gradient pulses is configured to allow acquisition of MR data for a respective first bladelet passing through a center of k-space, wherein the first bladelets are non-parallel with each other. The instructions also cause the computer to reconstruct the acquired MR data into an image.

20 Claims, 7 Drawing Sheets

U.S. PATENT DOCUMENTS

| | | | |
|---|---|---|---|
| 2006/0028206 A1* | 2/2006 | Zhang et al. | 324/309 |
| 2008/0139919 A1* | 6/2008 | Kannengiesser et al. | 600/410 |
| 2008/0157767 A1* | 7/2008 | Bammer et al. | 324/312 |
| 2008/0303521 A1* | 12/2008 | Beatty et al. | 324/312 |
| 2010/0039110 A1* | 2/2010 | Takahashi et al. | 324/310 |
| 2010/0188085 A1* | 7/2010 | Huo et al. | 324/309 |
| 2011/0241671 A1* | 10/2011 | Zhao et al. | 324/309 |

OTHER PUBLICATIONS

Pipe, "Motion Correction With PROPELLER MRI: Application to Head Motion and Free-Breathing Cardiac Imaging," Magnetic Resonance in Medicine, vol. 42, pp. 963-969, 1999.

Pipe et al., "Turboprop: Improved PROPELLER Imaging," Magnetic Resonance in Medicine, vol. 55, pp. 380-385, 2006.

* cited by examiner

SYSTEM AND METHOD FOR PROPELLER MAGNETIC RESONANCE IMAGING WITH NON-PARALLEL BLADELETS

CROSS-REFERENCE TO RELATED APPLICATIONS

The present application claims the benefit of U.S. Provisional Application Ser. No. 61/146,688 filed on Jan. 23, 2009, under 35 U.S.C. §119(e), the disclosure of which is incorporated herein by reference.

BACKGROUND OF THE INVENTION

The present invention relates generally to a method of MR imaging and, more particularly, to a system and method of PROPELLER magnetic resonance imaging.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Fast Spin Echo (FSE) imaging is an imaging technique commonly used as an efficient method of collecting MRI data with minimal artifact. Generally, FSE requires that the refocusing B1 pulses be applied between each echo such that their phase is substantially identical to that of the initial spin phase after excitation, commonly referred to as the "CPMG" condition. If this condition is not met, the resulting MR signal is in general highly sensitive to the strength of B1, and therefore will generally decay rapidly in successive echoes.

As a result, FSE imaging with diffusion weighted imaging (DWI) may be difficult, in general, since even minute patient motion during application of diffusion weighting gradients leaves the spins with a spatially varying and unknown starting phase prior to the spin-echo train. A number of imaging techniques have been developed that alters the phase of the refocusing pulses to attempt to delay the inevitable signal decay. However, these known techniques have been shown to prolong the signal magnitude, but, in general, cause a spatially varying phase which alternates between successive echoes, i.e., the signal in odd echoes encode an additive phase $\alpha(x,y)$, and even echoes encode the opposite phase $-\alpha(x,y)$. This makes combining the two sets of echoes difficult.

FSE imaging is an imaging technique that has been implemented with a number of pulse sequence designs. For example, one FSE technique, which is commonly referred to as Periodically Rotated Overlapping Parallel Lines with Enhanced Reconstruction (PROPELLER) imaging, encodes an MR signal by collecting data during an echo train such that a rectangular strip, or "blade", through the center of k-space is measured. This strip is incrementally rotated in k-space about the origin in subsequent echo trains, thereby allowing adequate measurement of the necessary regions of k-space for a desired resolution.

Another FSE technique, for example, which is commonly referred to as TURBOPROP, has been developed that acquires MR data from multi gradient echoes in each echo spacing. However, image artifacts may be visible in the reconstructed images that may be caused by off-resonance magnetization, susceptibility, gradient delay, or eddy currents.

It would therefore be desirable to have a system and method capable of acquiring multi-blade data in each echo spacing while reducing image artifacts.

BRIEF DESCRIPTION OF THE INVENTION

In accordance with one aspect of the invention, a computer readable storage medium has stored thereon a computer program comprising instructions which when executed by a computer cause the computer to apply a first plurality of radio frequency (RF) pulses during a first repetition time (TR) interval of a magnetic resonance (MR) pulse sequence. The instructions also cause the computer to apply a first plurality of gradient pulses and acquire the MR data during application of each gradient pulse of the first plurality of gradient pulses between an adjacent pair of RF pulses of the first plurality of RF pulses. Each gradient pulse of the first plurality of gradient pulses is configured to allow acquisition of MR data for a respective first bladelet passing through a center of k-space, wherein the first bladelets are non-parallel with each other. The instructions also cause the computer to reconstruct the acquired MR data into an image.

In accordance with another aspect of the invention, a method includes, for each of a plurality of echo spacings of an echo train of a pulse sequence, applying a plurality of gradient pulses toward an imaging object, the plurality of gradient pulses configured to allow acquisition of MR data for a plurality of respective, non-parallel bladelets passing through a center of k-space. The method also includes, for each of the plurality of echo spacings of the echo train of the pulse sequence, acquiring the MR data for the plurality of bladelets during application of each gradient pulse of the plurality of gradient pulses. The acquired MR data is reconstructed into an image, and the image is displayed to a user.

In accordance with a further aspect of the invention, MRI apparatus includes a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images. the MRI apparatus also includes a computer programmed to apply pulses of a pulse sequence toward an imaging object, wherein the pulse sequence comprises a plurality of echo spacing times. The computer is also programmed to acquire, during each echo spacing time, bladelet data corresponding to a plurality of separate, non-parallel bladelets of k-space data and to reconstruct acquired bladelet data into an image. The pulses include a plurality of radio frequency pulses, a first plurality of oscillating gradient pulses to be applied along a first gradient direction during a first set of echo spacing times of the plurality of echo spacing times, and a second plurality of gradient pulses to be applied along a second gradient direction simultaneously with the first plurality of oscillating gradient pulses Various other features and advantages of the present invention will be made apparent from the following detailed description and the drawings.

BRIEF DESCRIPTION OF THE DRAWINGS

The drawings illustrate one embodiment presently contemplated for carrying out the invention.

In the drawings.

DETAILED DESCRIPTION

Embodiments of the present invention provide a system and method of MR imaging particularly applicable with FSE protocols that overcome the aforementioned drawbacks. Data for multiple bladelets passing through the center of k-space are acquired in each echo spacing of an echo train. The multiple bladelets are incrementally rotated about the center of k-space with each echo train until a full set of k-space data is acquired. Data for each bladelet may be acquired as a single-blade bladelet, or odd and even echoes may be acquired and used to create separate split-blade bladelet strips in k-space. Preferably, each blade extends through the center of k-space. After a phase correction, each bladelet or each corresponding odd and even bladelet pair is used for image reconstruction.

Figure 1:
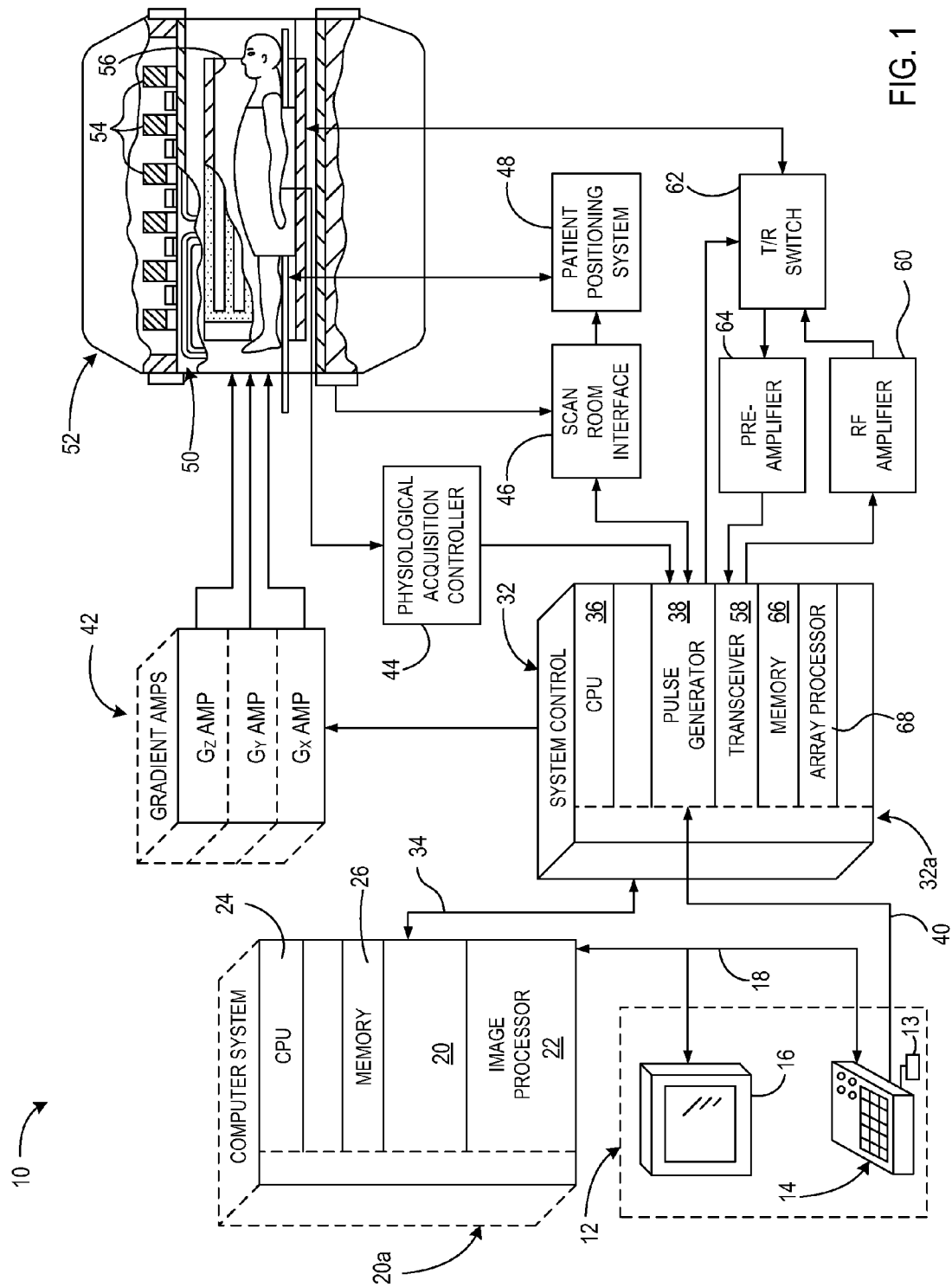
FIG. 1 is a schematic block diagram of an MR imaging system for use with the present invention.

Referring to FIG. 1, the major components of a magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and removable storage 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the removable storage 30, or it may be further processed by the image processor 22 and conveyed to the operator console 12 and presented on the display 16.

Figure 2:
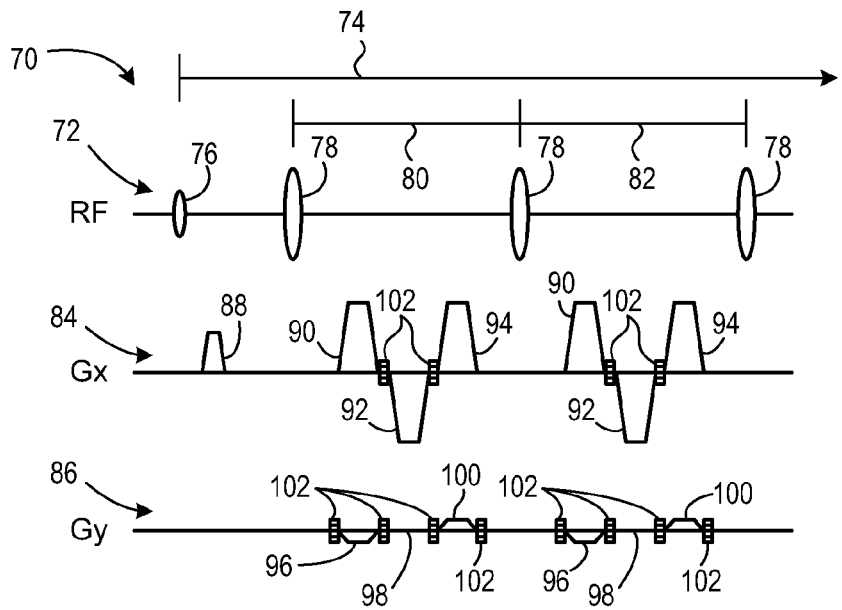
FIG. 2 is a pulse sequence diagram of a multiple bladelet pulse sequence according to an embodiment of the invention.

Referring now to FIG. 2, a portion of a single-blade, multiple bladelet protocol or pulse sequence 70 is illustrated according to an embodiment of the invention. It should be noted that slice encoding gradients, gradient crushers, and some balancing gradients are not shown. Pulse sequence 70 is constructed such that multiple spin-echoes resulting, in part, from an RF pulse train 72 are acquired during each repetition interval (TR) 74. Each TR 74 of pulse sequence 70 includes a first RF pulse 76 followed by a plurality of subsequent RF pulses 78. In one embodiment, RF pulse 76 has a flip angle of 90 degrees, and RF pulses 78 have flip angle pulses of 180 degrees. However, it is contemplated that RF pulses 76, 78 may have flip angles other than 90 degrees and 180 degrees, respectively. The length of TR 74 corresponds to the length between RF pulses 76, and RF pulse train 72 includes a number of echo spacings 80, 82 corresponding to the spacings between the RF pulses 78 thereof.

Shown in pulse sequence 70 are a pair of gradient pulse trains 84, 86 applied, respectively, along a Gx axis and a Gy axis. Gradient pulses of Gx correspond, in one example, to a phase direction, and gradient pulses of Gy correspond to a frequency direction. In one embodiment, a pre-phasor gradient pulse 88 is applied in the Gx gradient pulse train 84 after first RF pulse 76 and prior to the first subsequent RF pulse 78. It is contemplated, however, that the pre-phasor gradient pulse 88 may be applied at a different location (such as after RF pulse 78) and may have an opposite polarity than that shown.

As illustrated, the portions of the Gx and Gy gradient pulse trains 84, 86 corresponding to echo spacing 80 includes a plurality of gradients. Three gradient pulses 90, 92, 94 applied in Gx gradient pulse train 84 correspond to three respective gradient pulses 96, 98, 100 simultaneously applied in the Gy gradient pulse train 86. As shown in this embodiment, gradient pulses 90-94 oscillate about the Gx axis, and gradient pulses 96-100 relate to a stepping pattern. A plurality of additional gradient pulses 102 are applied to address the starting location for data acquisition during each respective pair of gradients, 90, 96; 92, 98; and 94, 100. While in the embodiment illustrated, gradient pulse 98 is shown as having a value of zero such that data for a horizontal bladelet may be acquired, for example, it is contemplated that a non-zero value for gradient pulse 98 may be applied. Furthermore, it is contemplated that embodiments of the invention may include values for gradient pulses 90-100 that vary from that illustrated in FIG. 2 in order to acquire data for bladelets having different orientations in k-space.

Data acquisition during application of gradient pulses 90-100 in echo spacing 80 causes data to be acquired for a single line of respective bladelets, each bladelet, oriented differently from the others and having data passing through the center of k-space. To acquire data for an additional line of the respective bladelets, gradient pulses 90-100 are repeated in echo spacing 82. Gradient pulses 102 are again applied in echo spacing 82; however, gradient pulses 102 in echo spacing 82 may be varied from gradient pulses 102 in echo spacing 80 as needed to address the different starting locations for the additional lines.

Figure 3:
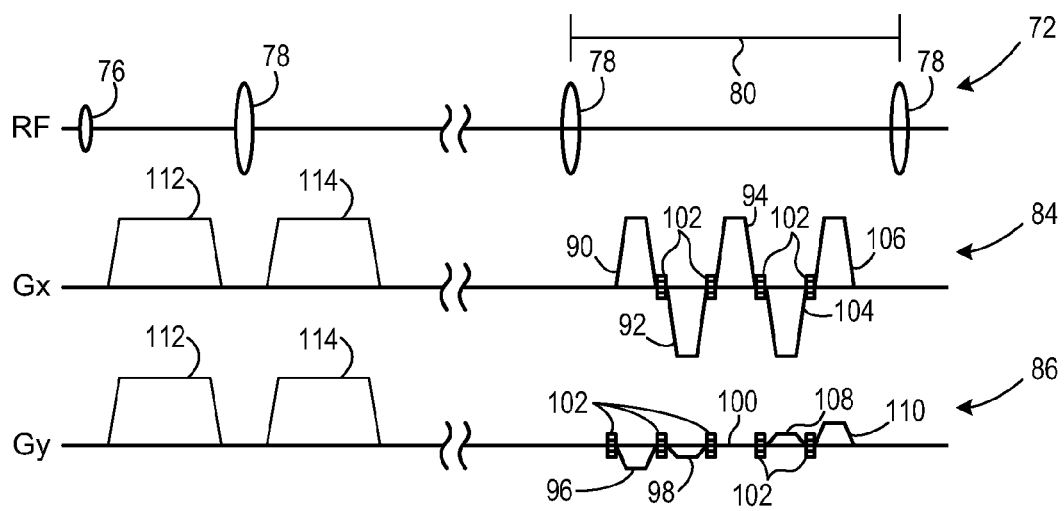
FIG. 3 is a pulse sequence diagram of a multiple bladelet pulse sequence according to another embodiment of the invention.

Gradient pulses 90-100 similar to those in echo spacings 80, 82 are repeated in subsequent echo spacings (not shown) along with respectively applied to gradient pulses 102 in order to fill out or acquire all of the data for each of the multiple bladelets. The number of echo spacings corresponds to the number of lines to be acquired in each respective bladelet. Furthermore, in addition to that shown, data for more or less than three bladelets may be acquired in each echo spacing. Each echo spacing is proportional to the number of bladelets for which data is to be acquired in each echo spacing. For example, FIG. 3 illustrates an embodiment of echo spacing 80 of pulse sequence 70 of FIG. 2 according to another embodiment of the invention. FIG. 3 shows that an additional set of gradient pulses 104, 106, 108, 110 may be applied in the Gx and Gy gradient pulse trains 84, 86 such that data for five bladelets may be acquired during each echo spacing. FIG. 3 also shows application of a pair of gradients 112, 114 according to one embodiment of the invention to enhance dephasing of the spins according to a Diffusion Weighted Imaging (DWI) protocol. Gradients may be applied simultaneously to the Gx axis, Gy axis, and to a Gz axis (not shown), for example. Other embodiments for applying gradients according to DWI sequences are also contemplated.

Figure 4:
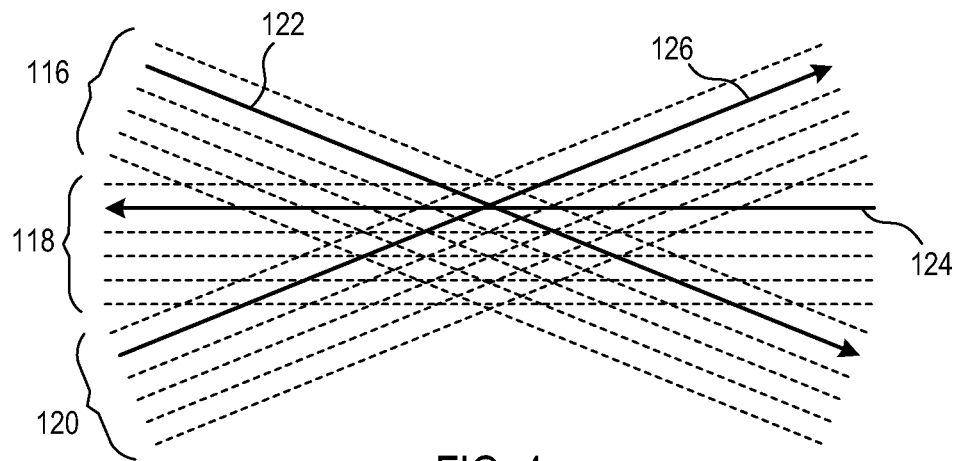
FIG. 4 is a graphical representation of multiple bladelets acquired via the pulse sequence of FIG. 2 according to an embodiment of the invention.

FIG. 4 shows a graphical representation of multiple bladelets that may be acquired, for example, via application of pulse sequence 70 of FIG. 2 according to an embodiment of the invention. Referring to FIGS. 2 and 4, three bladelets 116, 118, 120 in k-space are acquired after application of one TR 74. In one echo spacing, such as echo spacing 82, a respective line in each bladelet 116-120 is acquired. For example, during application of gradients 90 and 96, data for a line 122 of bladelet 116 may be acquired. During application of gradients 92 and 98, data for a line 124 of bladelet 118 may be acquired, and during application of gradients 94 and 100, data for a line 126 of bladelet 120 may be acquired. While FIG. 4 shows acquisition of adjacent bladelets 116-120, it is contemplated that the bladelets acquired in the same TR 74 may not be adjacent to each other. That is, bladelet 116 may be acquired with a first set of bladelets (not shown) in a first TR 74, bladelet 118 may be acquired with a second set of bladelets (not shown) in a second TR 74, and bladelet 120 may be acquired with a third set of bladelets (not shown) in a third TR 74.

Figure 5:
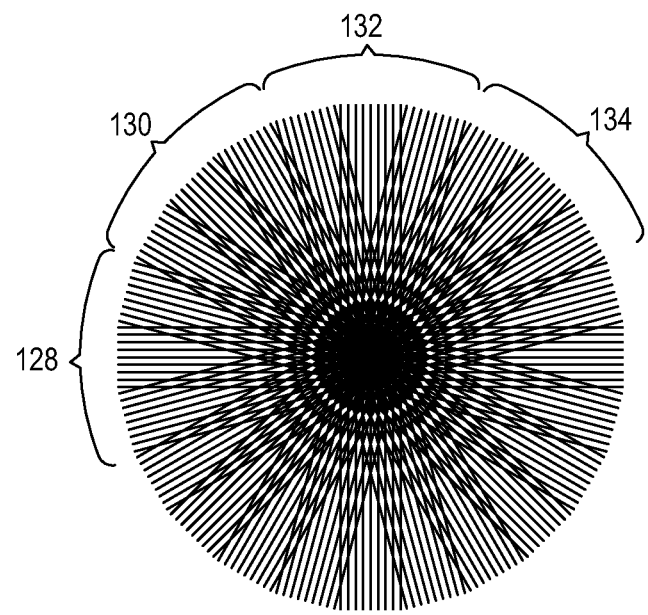
FIG. 5 is a graphical representation of a complete multiple bladelet dataset acquired via the pulse sequence of FIG. 2 according to an embodiment of the invention.

FIG. 5 shows a graphical representation of a complete dataset of multiple bladelets acquired via application of pulse sequence 70 of FIG. 2 according to an embodiment of the invention. Referring to FIGS. 2 and 5, a first set of bladelets 128 is acquired during a first TR 74. During subsequent repetition times, additional sets of bladelets 130, 132, 134 are acquired to fill in k-space.

Figure 6:
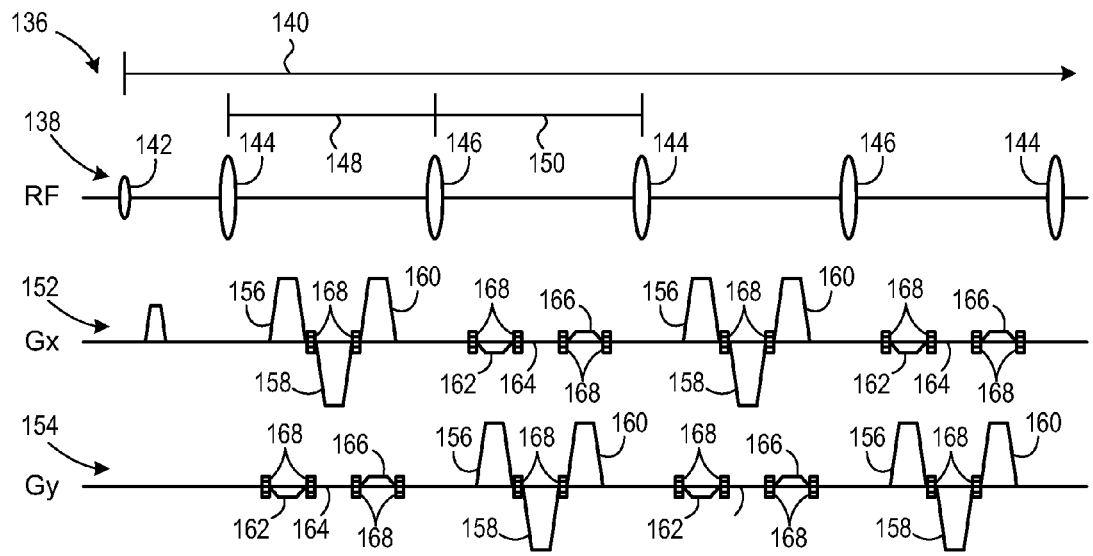
FIG. 6 is a pulse sequence diagram of a split-blade, multiple bladelet pulse sequence according to an embodiment of the invention.

FIG. 6 illustrates a portion of a split-blade, multiple bladelet protocol or pulse sequence 136 according to an embodiment of the invention. It should be noted that slice encoding gradients, gradient crushers, and some balancing gradients are not shown. Pulse sequence 136 is constructed such that multiple spin-echoes resulting, in part, from an RF pulse train 138 are acquired during each TR 140. Each TR 140 of pulse sequence 136 includes a first RF pulse 142 followed by a plurality of subsequent RF pulses 144, 146. In one embodiment, RF pulse 142 has a flip angle of 90 degrees, and RF pulses 144, 146 have flip angle pulses of 180 degrees. However, it is contemplated that RF pulses 142 and 144-146 may have flip angles other than 90 degrees and 180 degrees, respectively. The length of TR 140 corresponds to the length between RF pulses 142, and RF pulse train 138 includes a number of echo spacings 148, 150 corresponding to the spacings between the RF pulses 144 thereof.

FIG. 6 shows a plurality of gradient pulse trains 152, 154 having, in each echo spacing, gradients to be applied during data acquisition. During echo spacing 148, gradient pulse train 152 has three gradient pulses 156, 158, 160 applied simultaneously with three gradient pulses 162, 164, 166 of gradient pulse train 154. In addition, additional gradient pulses 168 are applied to address the starting location for data acquisition during each respective pair of gradients 156, 162; 158, 164; and 160, 166. During echo spacing 150, the gradient pulses are applied to the alternate gradient pulse train. That is, gradient pulses 156-160 are applied on gradient pulse train 154, and gradient pulses 162-166 are applied on gradient pulse train 152.

Figure 7:
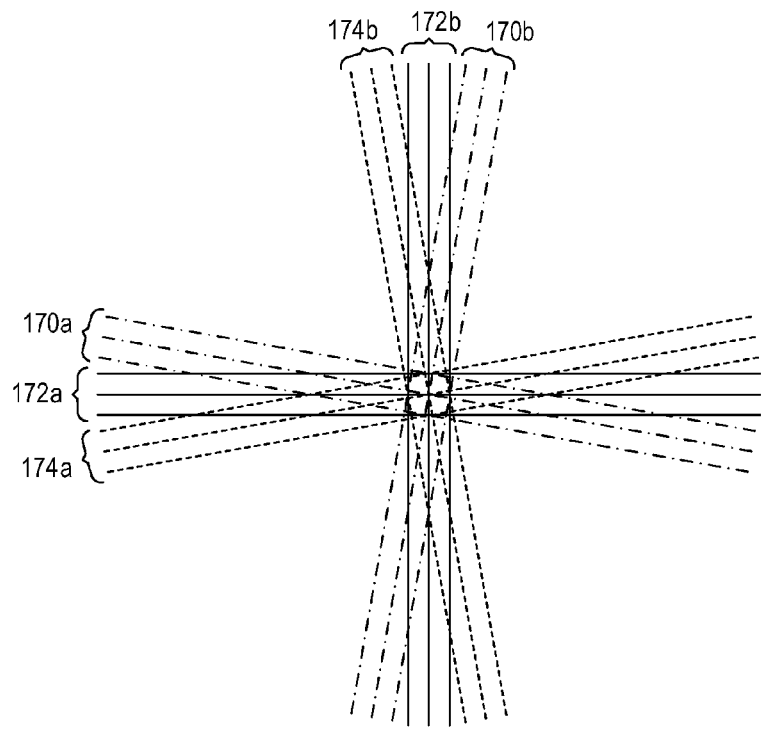
FIG. 7 is a graphical representation of multiple bladelets acquired via the pulse sequence of FIG. 6 according to an embodiment of the invention.

Referring to FIGS. 6 and 7, application of the alternating patterns of gradient pulses 156-168 after respective RF pulses 144, 146 causes multiple split-blade bladelets 170, 172, 174 to be acquired during TR 140. Each split-blade bladelet 170, 172, 174 includes orthogonal sub-blades 170a, 170b, 172a, 172b, 174a, and 174b, respectively. Following acquisition of split-blade bladelets 170-174 that fill up a portion of k-space, RF and gradient pulses of pulse sequence 136 are applied is subsequent repetition time intervals 140 while rotating the multiple split-blade bladelet group to acquire more data of k-space. Multiple TRs 140 are repeated until all of k-space has been acquired.

Figure 8:
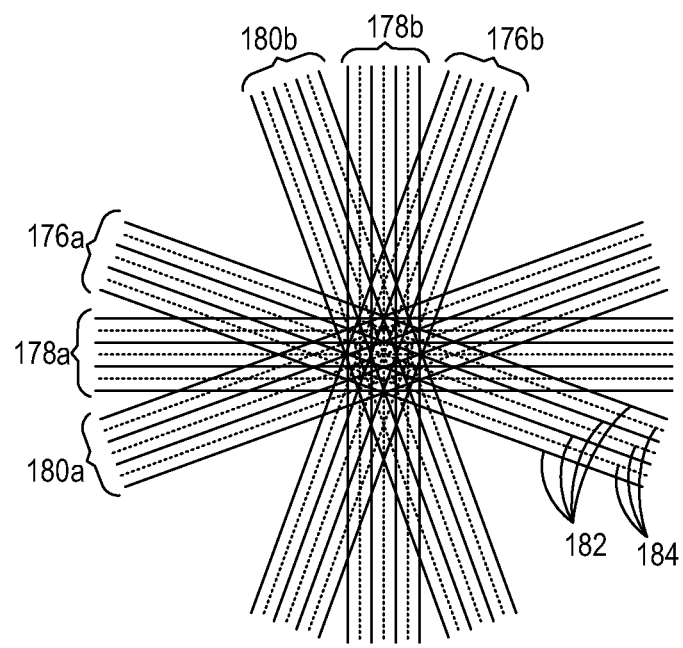
FIG. 8 is a graphical representation of multiple bladelets acquired via a pulse sequence including accelerated imaging according to an embodiment of the invention.

FIG. 8 illustrates acquired multiple split-blade bladelets 176, 178, 180 according to another embodiment of the invention. Similar to split-blade bladelets 170-174 shown in FIG. 7, each split-blade bladelet 176, 178, 180 includes orthogonal sub-blades 176a, 176b, 178a, 178b, 180a, and 180b, respectively. However, as shown in FIG. 8, acquisition of split-blade bladelets 176-180 includes multi-coil, accelerated imaging acquisition. That is, each split-blade bladelet 176, 178, 180 includes lines 182 of acquired k-space data with lines 184 of unacquired data between each line 182 of acquired k-space data. Acquisition of data in this manner allows a greater area of k-space to be acquired by each split-blade bladelet 176-180 and allows each sub-blade of acquired data, such as sub-blades 176a and 176b, for example, to mutually calibrate each other to synthesize or fill in the unacquired k-space data.

Figure 9:
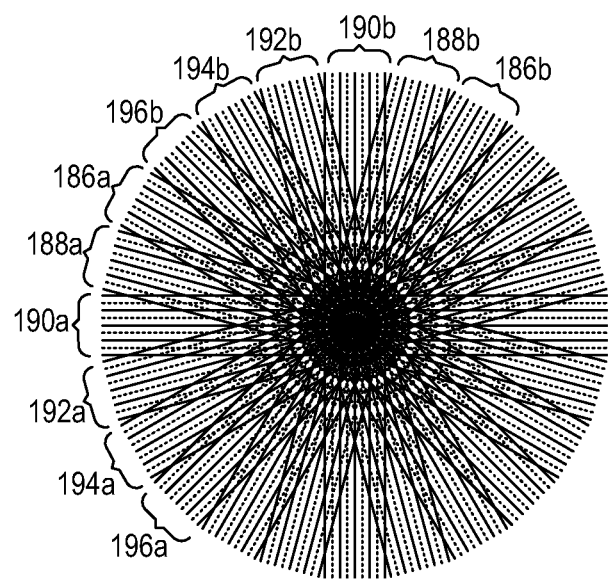
FIG. 9 is a graphical representation of a single-shot, multiple split-blade bladelet acquisition according to an embodiment of the invention.

FIG. 9 shows a multiple split-blade bladelet acquisition according to another embodiment of the invention. As shown, a plurality of split-blade bladelets 186, 188, 190, 192, 194, 196 may be acquired in one embodiment using a combination of accelerated imaging and multiple split-blade bladelet acquisition. In this manner, accelerated data may be acquired that covers all of k-space in a single shot. In this embodiment, data for six sub-blades are acquired in each echo spacing. Alternate echo spacings acquire k-space data for alternate sub-blades. It is contemplated that single-shot imaging according to embodiments of the invention may be performed with or without accelerated imaging.

Figure 10:
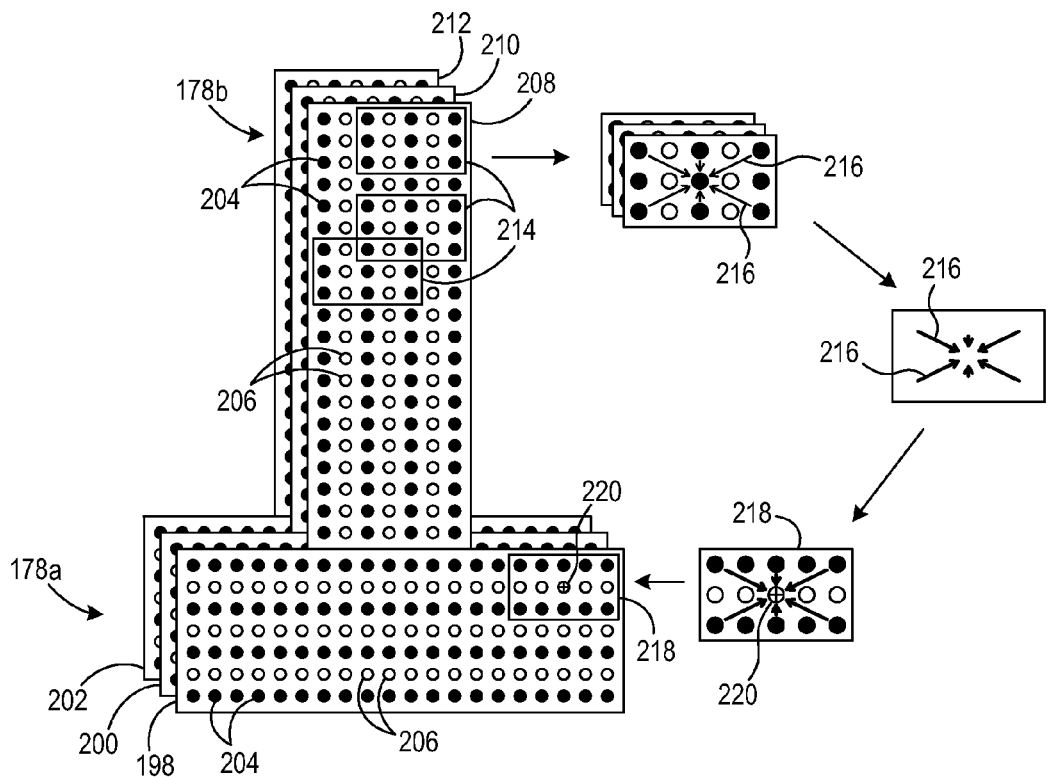
FIG. 10 is a graphical representation showing steps for mutually calibrating sub-blades of a split-blade bladelet according to an embodiment of the invention.

FIG. 10 graphically illustrates steps for mutually calibrating sub-blades of a split-blade bladelet according to an embodiment of the invention. Multi-coil, parallel imaging data acquired for sub-blade 178a is illustrated as a plurality of horizontal coil datasets 198, 200, 202 having acquired data represented by filled dots 204 and unacquired data represented by empty dots 206. Similarly, multi-coil, parallel imaging data acquired for sub-blade 178b is illustrated as a plurality of vertical coil datasets 208, 210, 212 having acquired data represented by filled dots 204 and unacquired data represented by empty dots 206.

To synthesize and fill in missing or unacquired data for coil dataset 198, data from coil datasets 208-212 are used. According to one embodiment, a plurality of k-space groupings 214 are acquired from each coil dataset 208-212. As shown in FIG. 10, three k-space groupings 214 are identified showing examples of different locations for selecting each k-space grouping. However, it is to be understood that all locations from which similar k-space groupings may be selected are acquired from all coil datasets 208-212.

After all k-space groupings 214 have been acquired, acquired data 204 in each grouping 214 is used to calculate calibration weights 216 that correlate data among some of the acquired data 204 in each grouping 214. The calibration weights 216 are calculated from a fitting of the center data point with the surrounding data points. Then, for each of a k-space grouping 218 of coil dataset 198, the set of calibration weights 216 can be used to calculate or synthesize the value for an unacquired data point 220. The synthesized value may be substituted for the unacquired data point 220, and another k-space grouping 218 of coil dataset 198 may be selected for calculating an unacquired data point therein. To synthesize the unacquired values for coil dataset 208, the described process is repeated by finding a set of calibration weights based on all coil datasets 198-202.

Figure 11:
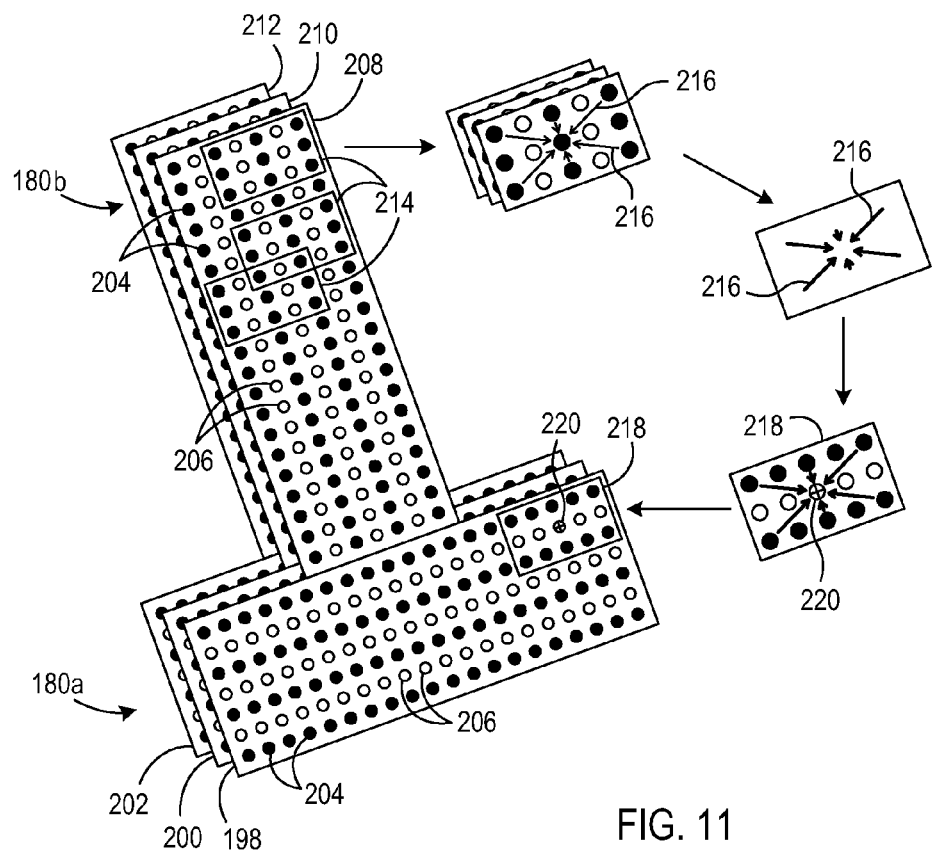
FIG. 11 is a graphical representation showing steps for mutually calibrating sub-blades of a different split-blade bladelet according to an embodiment of the invention.

FIG. 11 graphically illustrates that the steps for mutually calibrating sub-blades of a split-blade bladelet according to that described for FIG. 10 may be applied to the data for sub-blades 180a and 180b. According to embodiments of the invention, the steps graphically shown in FIGS. 10 and 11 are repeated for each sub-blade pair of accelerated k-space data acquired to fill k-space.

Figure 12:
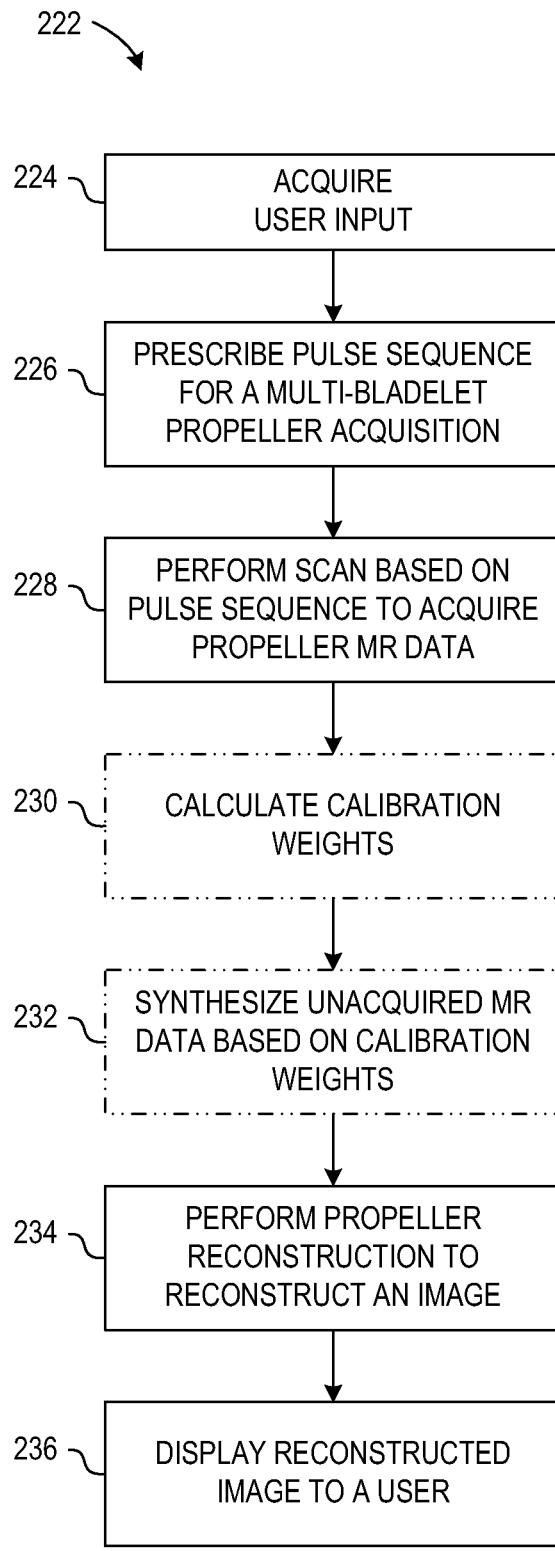
FIG. 12 is a multi-bladelet MR imaging technique according to an embodiment of the invention.

FIG. 12 shows a multi-bladelet MR imaging technique 222 according to an embodiment of the invention. Technique 222 includes acquiring user input at block 224. The user input may include parameters related to, for example, the number of echoes in the echo train length, the number of multiple bladelets to acquire in each TR period, and whether or not to perform split-blade and/or accelerated parallel imaging. At block 226, the pulse sequence for the multi-bladelet PROPELLER acquisition is prescribed based at least in part on the user input. The prescribed pulse sequence may be prescribed according to embodiments of the invention set forth herein. A scan based on the prescribed pulse sequence is performed at block 228 to acquire multi-bladelet PROPELLER MR data.

If split-blade, accelerated parallel imaging data is acquired, calibration weights are calculated at block 230 using data from all of the coils of a multi-coil array that was acquired for one of a pair of sub-blades. At block 232, the calculated calibration weights are applied to the data for one of the array coils for the other of the pair of sub-blades to synthesize unacquired data for the other sub-blade. Blocks 230 and 232 are preferably performed until all unacquired data has been synthesized.

At block 234, the acquired multi-bladelet PROPELLER MR data is reconstructed into an image via one or more PROPELLER reconstruction techniques known in the art. The reconstructed image may be displayed to a user at block 236.

According to embodiments of the invention, scan time for Diffusion-Weighted Imaging (DWI) may be reduced when performing imaging according to the embodiments described herein. In addition, embodiments of the invention can be used with single-shot DWI acquisition, and the scan time can be further reduced. Single-shot DWI in only a single TR period using embodiments of the invention allows for faster imaging scan times, which allows for reduced artifact, multi-blade acquisitions of regions of interest such as the abdomen or other moving area using breath-holds. Accordingly, FSE-based abdomen imaging is possible, which may be strongly affected by non-rigid motion artifacts.

Compared with the Echo Planar Imaging (EPI) technique, embodiments of the invention allow removal of susceptibility and warping artifacts, which allows for improved DW images. Compared with the PROPELLER technique, scan time for imaging according to embodiments of the invention is greatly reduced. While the Turboprop technique includes imaging scan time reduction, embodiments of the invention allow improvement over susceptibility and warping artifacts still observable in Turboprop.

In accordance with one embodiment of the invention, a computer readable storage medium has stored thereon a computer program comprising instructions which when executed by a computer cause the computer to apply a first plurality of radio frequency (RF) pulses during a first repetition time (TR) interval of a magnetic resonance (MR) pulse sequence. The instructions also cause the computer to apply a first plurality of gradient pulses and acquire the MR data during application of each gradient pulse of the first plurality of gradient pulses between an adjacent pair of RF pulses of the first plurality of RF pulses. Each gradient pulse of the first plurality of gradient pulses is configured to allow acquisition of MR data for a respective first bladelet passing through a center of k-space, wherein the first bladelets are non-parallel with each other. The instructions also cause the computer to reconstruct the acquired MR data into an image.

In accordance with another embodiment of the invention, a method includes, for each of a plurality of echo spacings of an echo train of a pulse sequence, applying a plurality of gradient pulses toward an imaging object, the plurality of gradient pulses configured to allow acquisition of MR data for a plurality of respective, non-parallel bladelets passing through a center of k-space. The method also includes, for each of the plurality of echo spacings of the echo train of the pulse sequence, acquiring the MR data for the plurality of bladelets during application of each gradient pulse of the plurality of gradient pulses. The acquired MR data is reconstructed into an image, and the image is displayed to a user.

In accordance with a further embodiment of the invention, MRI apparatus includes a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images. the MRI apparatus also includes a computer programmed to apply pulses of a pulse sequence toward an imaging object, wherein the pulse sequence comprises a plurality of echo spacing times. The computer is also programmed to acquire, during each echo spacing time, bladelet data corresponding to a plurality of separate, non-parallel bladelets of k-space data and to reconstruct acquired bladelet data into an image. The pulses include a plurality of radio frequency pulses, a first plurality of oscillating gradient pulses to be applied along a first gradient direction during a first set of echo spacing times of the plurality of echo spacing times, and a second plurality of gradient pulses to be applied along a second gradient direction simultaneously with the first plurality of oscillating gradient pulses.

Embodiments of the present invention have been described in terms of preferred embodiments, and it is recognized that equivalents, alternatives, and modifications, aside from those expressly stated, are possible and within the scope of the appending claims.

What is claimed is:

1. A non-transitory computer readable storage medium having stored thereon a computer program comprising instructions which when executed by a computer cause the computer to:

apply a first plurality of radio frequency (RF) pulses during a first repetition time (TR) interval of a magnetic resonance (MR) pulse sequence;

between an adjacent pair of RF pulses of the first plurality of RF pulses:
apply a first plurality of gradient pulses, each gradient pulse of the first plurality of gradient pulses configured to allow acquisition of MR data of a respective bladelet passing through a center of k-space, wherein the respective bladelets are non-parallel with each other and correspond with a first plurality of bladelets; and
acquire the MR data during application of each gradient pulse of the first plurality of gradient pulses; and
reconstruct the acquired MR data into an image.

2. The non-transitory computer readable storage medium of claim 1 wherein the instructions further cause the computer to repeat the application of the plurality of gradient pulses and the acquisition of the MR data between additional pairs of RF pulses of the first plurality of RF pulses to acquire a first set of full bladelets of k-space data.

3. The non-transitory computer readable storage medium of claim 2 wherein the instructions further cause the computer to:

apply a second plurality of RF pulses during a second TR interval of the MR pulse sequence;
between respective adjacent pairs of RF pulses of the second plurality of RF pulses:
apply a second plurality of gradient pulses, each gradient pulse of the second plurality of gradient pulses configured to allow acquisition of MR data of a respective bladelet corresponding with a second plurality of bladelets passing through the center of k-space, wherein the respective bladelets of the second plurality of bladelets are non-parallel with each other and are non-parallel with the first bladelets; and
acquire the MR data during application of each gradient pulse of the second plurality of gradient pulses; and
wherein the instructions that cause the computer to reconstruct the acquired MR data cause the computer to reconstruct the acquired MR data of the first and second bladelets into an image.

4. The non-transitory computer readable storage medium of claim 1 wherein the instructions that cause the computer to apply the first plurality of gradient pulses cause the computer to: apply a first subset of gradient pulses along a first gradient axis; and simultaneously apply a second subset of gradient pulses along a second gradient axis.

5. The non-transitory computer readable storage medium of claim 4 wherein the instructions further cause the computer to:

acquire a plurality of split-blade bladelets during the first TR interval, wherein the instructions that cause the computer to acquire the plurality of split- blade bladelets cause the computer to:
apply the first subset of gradient pulses along the first gradient axis between a first adjacent pair of RF pulses of the first plurality of RF pulses;
apply the second subset of gradient pulses along the second gradient axis between the first adjacent pair of RF pulses of the first plurality of RF pulses;
apply the first subset of gradient pulses along the second gradient axis between a subsequent adjacent pair of RF pulses of the first plurality of RF pulses; and
apply the second subset of gradient pulses along the first gradient axis between the subsequent adjacent pair of RF pulses of the first plurality of RF pulses.

6. The non-transitory computer readable storage medium of claim 5 wherein the instructions that cause the computer to acquire the plurality of split-blade bladelets, also cause the computer to:
acquire a plurality of accelerated split-blade bladelets, each accelerated split-blade bladelet comprising:
a first sub-blade; and
a second sub-blade orthogonal to the first sub-blade, wherein each of the first and second sub-blades comprises:
a set of acquired MR data; and
a set of unacquired MR data.

7. The non-transitory computer readable storage medium of claim 6 wherein the instructions further cause the computer to:
synthesize the set of unacquired MR data of the first sub-blade based on the set of acquired MR data of the second sub-blade; and synthesize the set of unacquired MR data of the second sub-blade based on the set of acquired MR data of the first sub-blade.

8. The non-transitory computer readable storage medium of claim 7 wherein the instructions further cause the computer to:
calculate a first set of calibration weights based on the set of acquired MR data of the first sub-blade;
calculate a second set of calibration weights based on the set of acquired MR data of the second sub-blade;
wherein the instructions that cause the computer to synthesize the set of unacquired MR data of the first sub-blade cause the computer to synthesize the set of unacquired MR data of the first sub-blade using the second set of calibration weights; and
wherein the instructions that cause the computer to synthesize the set of unacquired MR data of the second sub-blade cause the computer to synthesize the set of unacquired MR data of the first sub-blade using the first set of calibration weights.

9. The non-transitory computer readable storage medium of claim 6 wherein the instructions that cause the computer to apply the first plurality of RF pulses cause the computer to apply the first plurality of RF pulses during a single TR period of a single-shot MR pulse sequence.

10. The non-transitory computer readable storage medium of claim 1 wherein the instructions further cause the computer to apply a plurality of gradient lobes configured to enhance dephasing of spins according to a Diffusion Weighted Imaging sequence.

11. A method of processing a magnetic resonance pulse sequence comprising:
apply a first plurality of radio frequency (RF) pulses during a first repetition time (TR) interval of a magnetic resonance (MR) pulse sequence which has a plurality of echo spacings within an echo train of the pulse sequence;
for each of the plurality of echo spacings within the echo train of the pulse sequence, between an adjacent pair of RF pulses of the first plurality of RF pulses:
applying a plurality of gradient pulses toward an imaging object, the plurality of gradient pulses configured to allow acquisition of MR data for a plurality of respective, non-parallel bladelets passing through a center of k-space; and
acquiring the MR data for the plurality of bladelets during application of each gradient pulse of the plurality of gradient pulses;
reconstructing the acquired MR data into an image; and
displaying the image to a user.

12. The method of claim 11 further comprising, for each of a plurality of subsequent echo trains:
modifying the plurality of gradient pulses such that the modified plurality of gradient pulses is configured to allow acquisition of MR data for a plurality of respective, non- parallel bladelets corresponding to the subsequent echo train;
each bladelet passing through the center of k-space and having a distinct rotation orientation about the center of k-space with respect to each other bladelet of the pulse sequence;
for each of a plurality of echo spacings of the plurality of subsequent echo trains:
applying the modified plurality of gradient pulses to the imaging object; and
acquiring the MR data for the plurality of bladelets corresponding to the subsequent echo train during application of each gradient pulse of the modified plurality of gradient pulses.

13. The method of claim 11 wherein reconstructing further comprises:
reconstructing the acquired MR data into the image after only a single repetition time (TR) interval of the pulse sequence, and the pulse sequence comprising:
a single-shot pulse sequence.

14. The method of claim 13 wherein acquiring the MR data comprises:
acquiring the MR data such that each of the plurality of bladelets comprises:
acquired lines of MR data and
unacquired lines of MR data between the acquired lines of MR data.

15. The method of claim 11 wherein acquiring the MR data comprises:
acquiring the MR data corresponding to orthogonal sub-blades of a plurality of split-blade bladelets,
wherein each of the sub-blades passes through the center of k-space and has a distinct rotation orientation about the center of k-space with respect to each other sub-blade of the pulse sequence.

16. An MRI apparatus comprising:
a magnetic resonance imaging (MRI) system having a plurality of gradient coils positioned about a bore of a magnet in order to impress a polarizing magnetic field and
an RF transceiver system and
an RF switch controlled by a pulse module in order to transmit RF signals to an RF coil assembly in order to acquire MR images; and
a computer programmed in order to:
apply a plurality of radio frequency and gradient pulses of a magnetic resonance (MR) pulse sequence toward an imaging object, wherein the MR pulse sequence comprises:
a plurality of pulses:
a plurality of echo spacing times; and
a repetition time (TR) interval;
wherein the plurality of pulses comprise:
a plurality of radio frequency pulses applied during the TR interval with the plurality of echo spacings occurring between an adjacent pair of RF pulses;
a first plurality of oscillating gradient pulses applied along a first gradient direction during a first set of echo spacing times of the plurality of echo spacing times; and a second plurality of gradient pulses applied along a second gradient direction simultaneously with the first plurality of oscillating gradient pulses;

acquire, during each echo spacing time, bladelet data corresponding to a plurality of separate, non-parallel bladelets of k-space data; and reconstruct acquired bladelet data into an image.

17. The MRI apparatus of claim 16 wherein the computer is further programmed in order to:

apply pulses comprising:

a third plurality of oscillating gradient pulses to be applied along the second gradient direction during a second set of echo spacing times of the plurality of echo spacing times, the first set of echo spacing times alternating with the second set of echo spacing times; and a fourth plurality of gradient pulses to be applied along the first gradient direction simultaneously with the third plurality of oscillating gradient pulses.

18. The MRI apparatus of claim 17 wherein the RF coil assembly comprises:

a plurality of RF coils; and wherein the computer, in being programmed to acquire the bladelet data, is programmed in order to acquire the bladelet data via each of the plurality of RF coils according to an accelerated, split-blade single-shot imaging technique.

19. The MRI apparatus of claim 16 wherein the computer is further programmed in order to:

prescribe a number of repetition time intervals and prescribe a number of echo spacing times in each repetition time interval of the pulse sequence based on a user input.

20. The MRI apparatus of claim 16 wherein the computer is further programmed in order to apply a plurality of gradient pulses according to a Diffusion Weighted Imaging pulse sequence.

* * * * *